United States Patent
Chang et al.

(10) Patent No.: US 9,042,106 B2
(45) Date of Patent: May 26, 2015

(54) THIN FILM TYPE CHIP DEVICE AND METHOD FOR MANUFACTURING THE SAME

(71) Applicant: SAMSUNG ELECTRO-MECHANICS CO., LTD., Suwon-si, Gyeonggi-do (KR)

(72) Inventors: Geon Se Chang, Suwon-si (KR); Sung Kwon Wi, Suwon-si (KR); Yong Suk Kim, Suwon-si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/078,033

(22) Filed: Nov. 12, 2013

(65) Prior Publication Data

US 2014/0133107 A1    May 15, 2014

(30) Foreign Application Priority Data

Nov. 13, 2012   (KR) .................. 10-2012-0128154

(51) Int. Cl.
H05K 1/16    (2006.01)
H01F 17/00   (2006.01)
H05K 3/00    (2006.01)

(52) U.S. Cl.
CPC .............. H05K 1/165 (2013.01); H05K 3/0052 (2013.01); H05K 2201/09672 (2013.01); H05K 2203/061 (2013.01); H01F 17/0013 (2013.01)

(58) Field of Classification Search
CPC ......... H05K 1/16; H05K 1/162; H05K 1/165; H01F 17/0013

USPC .......................................... 361/748; 29/602.1
See application file for complete search history.

(56) References Cited

U.S. PATENT DOCUMENTS

| 5,126,707 | A  | * | 6/1992  | Ikeda .............................. 333/185 |
| 5,278,526 | A  | * | 1/1994  | Ikeda .............................. 333/185 |
| 6,917,274 | B2 | * | 7/2005  | Hong et al. ..................... 336/200 |
| 7,231,707 | B2 | * | 6/2007  | Nuytkens et al. ............... 29/606 |
| 7,959,821 | B2 | * | 6/2011  | Kato et al. ............. 252/62.51 R |
| 2002/0167783 | A1 | * | 11/2002 | Waffenschmidt et al. .... 361/303 |
| 2005/0003199 | A1 | * | 1/2005  | Takaya et al. .................. 428/413 |
| 2005/0029515 | A1 | * | 2/2005  | Nagai et al. ..................... 257/40 |
| 2006/0044731 | A1 | * | 3/2006  | Karatsu et al. ................. 361/271 |
| 2008/0044660 | A1 | * | 2/2008  | Takaya et al. .................. 428/413 |
| 2010/0157496 | A1 | * | 6/2010  | Asakura et al. ................. 361/56 |
| 2011/0316658 | A1 | * | 12/2011 | Liu .................................. 336/200 |
| 2013/0009740 | A1 | * | 1/2013  | Chang et al. ................... 336/200 |
| 2013/0107486 | A1 | * | 5/2013  | Hiralal ............................ 361/782 |
| 2013/0154767 | A1 | * | 6/2013  | Kim et al. ....................... 333/185 |
| 2013/0162385 | A1 | * | 6/2013  | Kwak et al. .................... 336/200 |
| 2013/0234819 | A1 | * | 9/2013  | Yoo et al. ........................ 336/200 |
| 2013/0234820 | A1 | * | 9/2013  | Yoo et al. ........................ 336/200 |
| 2013/0258555 | A1 | * | 10/2013 | Chiu et al. ...................... 361/528 |
| 2014/0145797 | A1 | * | 5/2014  | Bae et al. ........................ 333/185 |
| 2014/0145812 | A1 | * | 5/2014  | Lee et al. ........................ 336/200 |
| 2014/0186526 | A1 | * | 7/2014  | Chang et al. ................... 427/130 |
| 2014/0218150 | A1 | * | 8/2014  | Cho et al. ........................ 336/92 |

FOREIGN PATENT DOCUMENTS

KR          10-0428900 B1    4/2004

* cited by examiner

Primary Examiner — Jeremy C Norris
Assistant Examiner — Nathan Milakovich
(74) Attorney, Agent, or Firm — McDermott Will & Emery LLP (57) ABSTRACT

Disclosed herein is a thin film type chip device, including: a plurality of unit circuit structures laminated on a substrate; and an adhesive layer adhering the unit circuit structures to each other.

11 Claims, 5 Drawing Sheets

THIN FILM TYPE CHIP DEVICE AND METHOD FOR MANUFACTURING THE SAME

CROSS REFERENCE(S) TO RELATED APPLICATIONS

This application claims the benefit under 35 U.S.C. Section 119 of Korean Patent Application Serial No. 10-2012-0128154, entitled "Thin Film Type Chip Device and Method for Manufacturing the Same" filed on Nov. 13, 2012, which is hereby incorporated by reference in its entirety into this application.

BACKGROUND OF THE INVENTION

1. Technical Field

The present invention relates to a thin film type chip device and a method for manufacturing the same, and more particularly, to a thin film type chip device improving impedance characteristics and manufacturing process efficiency and a method for manufacturing the same.

2. Description of the Related Art

Recently, in accordance with high specification, multi-functionalization and miniaturization of electronic devices such as a smart phone, it is necessary to apply a filter for removing a common mode noise in a circuit such as a high speed interface using a differential transmission method to these electronic devices. To this end, the development for a small common mode noise filter (CMF) having high performance has been conducted.

In order to increase performance of a thin film type common mode noise filter, impedance should basically be increased. As a method of increasing impedance characteristics of a chip device, a method of further integrating a coil metal pattern in the filter to increase an area occupied by the coil metal pattern per unit area while making the coil metal pattern a fine pitch is efficient. To this end, the integration of the coil metal pattern by a method of implementing the coil metal patterns as a laminated structure so as to have a multi-layer structure, a method of increasing turns of the coil metal pattern, or the like, has been conducted.

In general, the coil metal pattern having the multi-layer structure has been formed by repeatedly performing a plating process using a photo-resist pattern on a ferrite magnetic substrate to sequentially laminate the coil metal patterns. However, in the case of the method as described above, during a process in which a lower circuit layer having a coil pattern is formed and a next circuit layer is then laminated on the lower circuit layer, a bumpy surface phenomenon that a surface of a photo-resist film covering the circuit pattern of the lower circuit layer becomes convex occurs. When the phenomenon that the surface of the photo-resist film becomes convex occurs, at the time of performing exposure and development processes as subsequent processes, the photo-resist film is excessively etched and removed or a photo-resist pattern having a hole with an inclined side is formed, such that it is difficult to form a fine circuit pattern as the number of layers of the circuit pattern increase.

RELATED ART DOCUMENT

Patent Document (Patent Document 1) Korean Patent No. 10-0428900

SUMMARY OF THE INVENTION

An object of the present invention is to provide a thin film type chip device improving impedance.

Another object of the present invention is to provide a thin film type chip device having a fine pitch and a coil pattern of a multi-layer structure.

Still another object of the present invention is to provide a method for manufacturing a thin film type chip device capable of improving impedance.

Still another object of the present invention is to provide a method for manufacturing a thin film type chip device preventing reduction in efficiency of forming a circuit pattern having a fine pitch to thereby improve efficiency of a manufacturing process.

According to an exemplary embodiment of the present invention, there is provided a thin film type chip device, including: a substrate; a plurality of unit circuit structures laminated on the substrate; and an adhesive layer adhering the unit circuit structures to each other.

Each of the unit circuit structures may include: a lower pattern; a lower polymer insulating layer covering the lower pattern; an upper pattern disposed over the lower pattern; and an upper polymer insulating layer having the same material as the lower polymer insulating layer and covering the upper pattern and the lower polymer insulating layer.

Each of the unit circuit structures may include: a metal coil pattern of a multi-layer structure; and a polymer insulating layer covering the metal coil pattern.

The substrate may be a ferrite magnetic substrate.

The adhesive layer may be an electrolyte polymer layer containing electrolyte elements.

The adhesive layer may include at least one of sodium element (Na), potassium element (K), calcium element (Ca), and magnesium element (Mg).

The adhesive layer may have electroneutrality by electrically coupling a polymer ion having a positive charge and a polymer ion having a negative charge to each other.

According to another exemplary embodiment of the present invention, there is provided a method for manufacturing a thin film type chip device, the method including: preparing a plurality of unit circuit structures; manufacturing a laminate by laminating the unit circuit structures; and adhering the unit circuit structures to each other.

The preparing of the unit circuit structures may include: preparing a substrate; forming a lower pattern on the substrate; forming a lower polymer insulating layer covering the lower pattern; forming an upper pattern on the lower polymer insulating layer; and forming an upper polymer insulating layer having the same material as the lower polymer insulating layer on the upper pattern.

The preparing of the unit circuit structures may include: forming a circuit layer having a metal coil of a multi-layer structure; and forming a adhesive layer on the circuit layer, and the laminating of the unit circuit structures may include aligning the unit circuit structures so that the adhesive layers of the unit circuit structures face each other.

The preparing of the unit circuit structures may include: forming a circuit layer having a metal coil of a multi-layer structure and a polymer insulating layer covering the metal coil; and forming an adhesive layer having electrolyte elements on the circuit layer, and the adhering of the unit circuit structures may include applying voltage to the laminate.

The preparing of the unit circuit structures may include: preparing a ferrite magnetic substrate; and forming a circuit layer having a metal coil of a multi-layer structure on the ferrite magnetic substrate.

The preparing of the unit circuit structures may include: preparing a substrate; and forming a circuit layer having a metal coil of a multi-layer structure on the substrate, and the method may further include, after the adhering of the unit circuit structures, removing the substrate from any one of the unit circuit structures.

DESCRIPTION OF THE PREFERRED EMBODIMENTS

Various advantages and features of the present invention and methods accomplishing thereof will become apparent from the following description of embodiments with reference to the accompanying drawings. However, the present invention may be modified in many different forms and it should not be limited to the embodiments set forth herein. These embodiments may be provided so that this disclosure will be thorough and complete, and will fully convey the scope of the invention to those skilled in the art. Like reference numerals throughout the description denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

Hereinafter, a thin film type chip device and a method for manufacturing the same will be described in detail with reference to the accompanying drawings.

Figure 1:
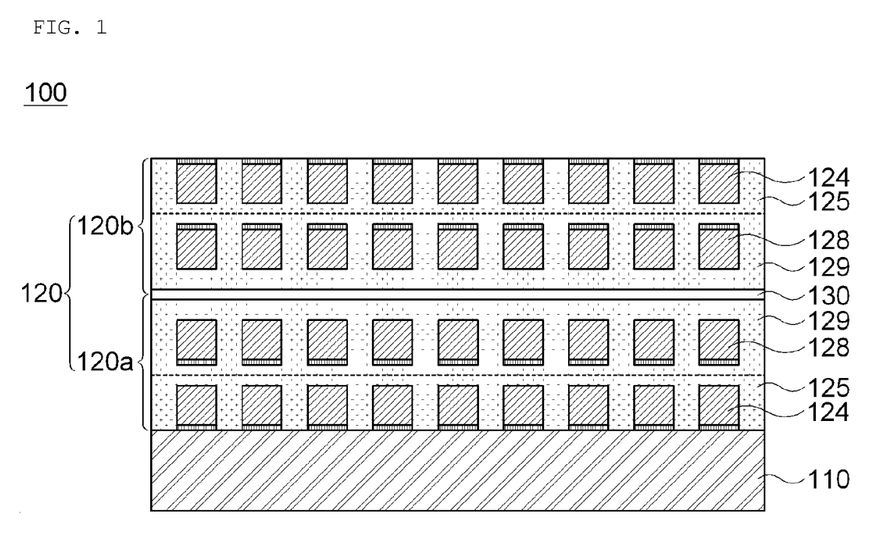
FIG. 1 is a view showing a thin film type chip device according to an exemplary embodiment of the present invention.

FIG. 1 is a view showing a thin film type chip device according to an exemplary embodiment of the present invention. Referring to FIG. 1, the thin film type chip device 100 according to the exemplary embodiment of the present invention may a chip component included in a multi-function and high-performance electronic device such as a smart phone. For example, the thin film type chip device 100 may be a common mode noise filter (CMF) or a thin film type chip inductor.

The thin film type chip device 100 may include a substrate 110 and a unit circuit structure 120 laminated on the substrate 110. The substrate 110 may be a base for manufacturing the unit circuit structure 120. As the substrate 110, a ferrite magnetic substrate may be used.

The unit circuit structure 120 may be provided in plural. The unit circuit structure 120 may be formed of a plurality of laminates having structures that are substantially the same as or similar to each other and each of the laminates may have a coil pattern of a multi-layer structure. Each of the laminates may be manufactured by a separate manufacturing process. A detailed manufacturing process of each unit circuit structure 120 will be described below.

As an example, the unit circuit structure 120 may include a first unit structure 120a and a second unit structure 120b which are sequentially laminated on the substrate 110. The first unit structure 120a may be configured of a circuit pattern of a multi-layer structure and a polymer insulating layer covering the circuit pattern. For example, the first unit structure 120a may include a lower pattern 124 formed on the substrate 110, an upper pattern 128 laminated on the lower pattern 124, and the polymer insulating layer covering the upper and lower patterns 124 and 128. Each of the upper and lower patterns 124 and 128 may be a metal pattern provided in a coil form and may have a structure similar to each other. During a process of manufacturing the polymer insulating, a lower polymer insulating layer 125 covering the lower pattern 124 and an upper polymer insulating layer 129 covering the upper pattern 128 on the lower polymer insulating layer 125 may be formed by a separate process. In this case, the lower polymer insulating layer 125 and the upper polymer insulating layer 129 may be made of the same material, thereby making it possible to form one polymer insulating layer.

The second unit structure 120b may have substantially the same structure as the first unit structure 120a. For example, the second unit structure 120a may be configured of a circuit pattern of a multi-layer structure configured of the upper pattern 128 and the lower pattern 124 and a polymer insulating layer covering the circuit pattern.

Meanwhile, the thin film type chip device 100 may further include a adhesive layer 130 adhering the laminates of the unit circuit structure 120 to each other. As an example, the adhesive layer 130 may adhere the first unit structure 120a and the second unit structure 120b to each other with electric or chemical coupling force between the first unit structure 120a and the second unit structure 120b. The adhesive layer 130 may be provided as an electrolyte polymer layer containing electrolyte elements. The electrolyte elements may be at least one of sodium element (Na), potassium element (K), calcium element (Ca), magnesium element (Mg), and other various elements.

In addition, positive charge polymer ions ($Poly^+$ in FIG. 8) electrically or chemically coupled to negative charge polymer ions ($Poly^-$ in FIG. 8) in the first and second unit structures 120a and 120b may be provided in the adhesive layer 130. Therefore, the adhesive layer 130 have neutrality, and the adhesive layer 130 and the unit circuit structures 120 may be adhered to each other by an electrochemical coupling of the polymer ions.

As described above, the thin film type chip device 100 according to the exemplary embodiment of the present invention includes the first and second unit structures 120a and 120b sequentially laminated on the substrate 110, wherein the first and second unit structures 120a and 120b may each have coil patterns of the multi-layer structure. The thin film type chip device 100 as described above has a structure capable of implementing a coil pattern circuit having a high occupying area per unit area while having a relatively fine pitch, thereby making it possible to accomplish high impedance characteristics. Therefore, the thin film type chip device according to the exemplary embodiment of the present invention includes the coil patterns of the multi-layer structure having the high occupying area per unit area while having the fine pitch, thereby making it possible to have high impedance characteristics.

In addition, the thin film type chip device 100 according to the exemplary embodiment of the present invention laminates the first and second unit structures 120a and 120b having the adhesive layer 130 interposed therebetween, wherein the adhesive layer may adhere the first and second unit structures 120a and 120b with the electrochemical coupling force of the polymer ions. The thin film type chip device 100 having the structure as described above manufactures the circuit pattern of the multi-layer structure by a scheme in which pre-manufactured circuit structures are sequentially laminated using the adhesive layer 130, thereby making it possible to effectively implement the circuit pattern of the multi-layer structure, as compared to the case in which the circuit pattern of the multi-layer structure is implemented by repeatedly performing a process using a photo-resist pattern. Particularly, in the case in which the circuit pattern is implemented by repeatedly performing the process using the photo-resist pattern according to the related art, due to a bumpy surface phenomenon in which a surface of the photo-resist pattern has a convex shape, the photo-resist pattern is excessively etched and removed by exposure and development process or a hole having an inclined side is formed for the photo-resist pattern, such that it may be difficult to form the circuit pattern of the fine pitch. However, in the case in which the adhesive layer 130 is used, the unit circuit structures 120 are laminated so that the desired number of layers of the circuit pattern is implemented, thereby making it possible to basically solve the problem due to the bumpy surface phenomenon. Therefore, since the thin film type chip device according to the exemplary embodiment of the present invention has the structure in which the circuit layers having the circuit patterns of the multi-layer structure are adhered to each other with the electrochemical coupling force by the adhesive layer and are laminated, it has the circuit structure having the circuit patterns of the multi-layer structure having the fine circuit pattern as compared to the structure in which the circuit layers are laminated using the photo-resist pattern without using the adhesive layer, thereby making it possible to greatly improve impedance characteristics.

Hereinafter, a method for manufacturing the thin film type chip device according to the exemplary embodiment of the present invention will be described in detail. Herein, a description of portions overlapped with the thin film type chip device 100 according to the exemplary embodiment of the present invention described above will be omitted or simplified.

Figure 2:
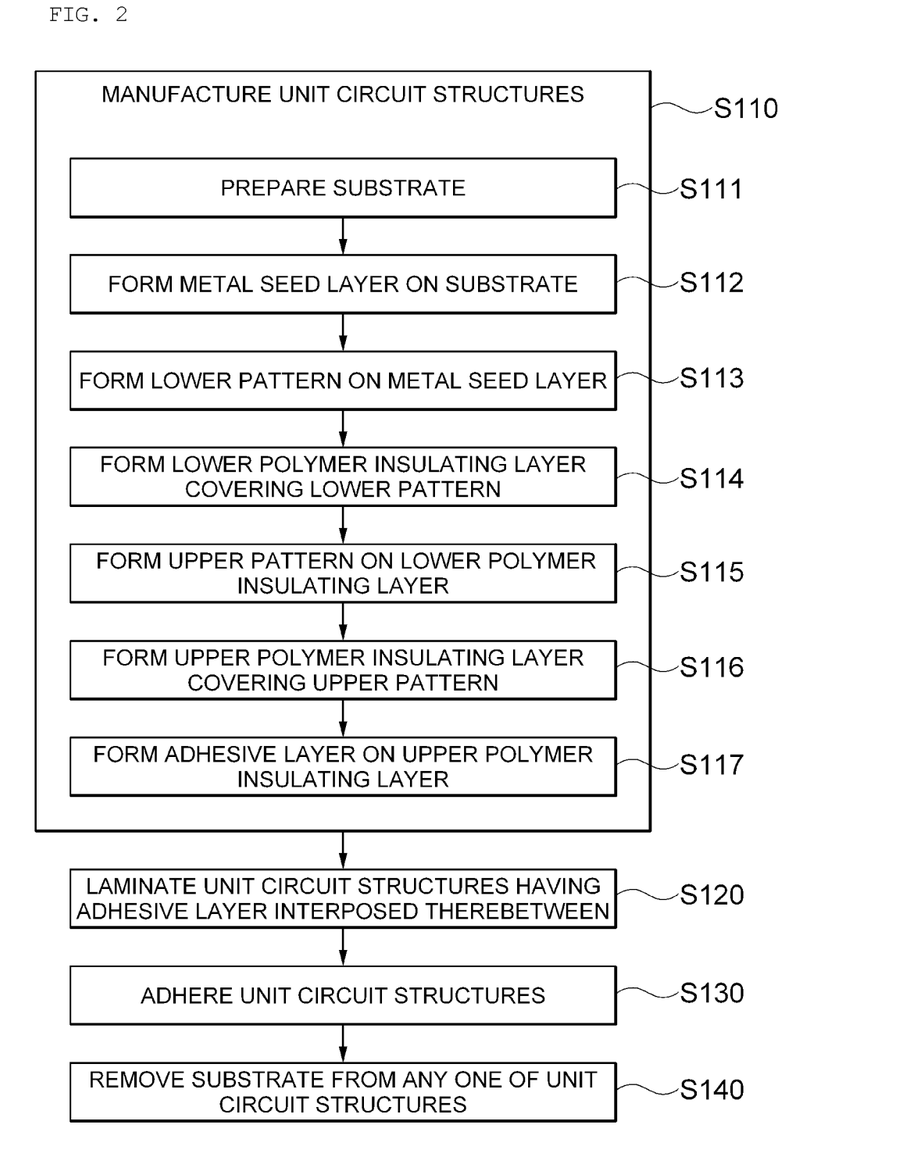
FIG. 2 is a flow chart showing a method for manufacturing a thin film type chip device according to the exemplary embodiment of the present invention.

FIG. 2 is a flow chart showing a method for manufacturing a thin film type chip device according to the exemplary embodiment of the present invention and FIGS. 3 to 9 are views describing a process for manufacturing a thin film type chip device according to the exemplary embodiment of the present invention.

Figure 3:
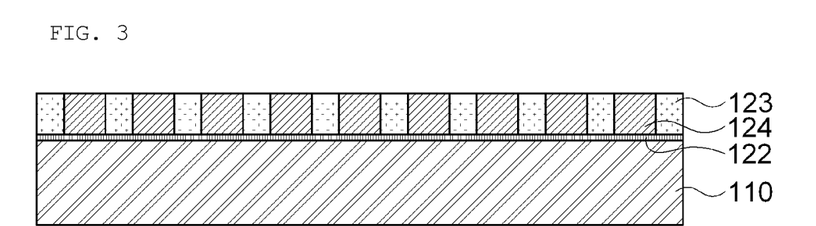
FIGS. 3 to 9 are views describing a process for manufacturing a thin film type chip device according to the exemplary embodiment of the present invention.

Referring to FIGS. 2 and 3, the unit circuit structures may be manufactured (S110). First, the substrate 110 may be prepared (S111). The substrate 110 may be used as a base for manufacturing the unit circuit structure. As the substrate 110, a ferrite magnetic substrate may be used.

A metal seed layer 122 may be formed on the substrate 110 (S112). The metal seed layer 122 may be provided to form a plating pattern on the substrate 110. The metal seed layer 122 may be formed by conducting a sputtering process using a metal target such as titanium (Ti), copper (Cu), and chrome (Cr). As an example, in the forming of the metal seed layer 122, a copper sputtering process for the substrate 110 is performed to thereby form a copper thin film on the substrate 110.

A lower pattern 124 may be formed on the metal seed layer 122 (S113). The forming of the lower pattern 124 may include forming a resist pattern 123 on the metal seed layer 122 and performing an electroplating process in which the metal seed layer 122 selectively exposed by the resist pattern 123 is used as a seed. When the electroplating process is completed, the resist pattern 123 and a portion of the metal seed layer 122 other than a coil forming region may be sequentially removed. Therefore, a metal lower pattern 124 in a coil form may be formed on the metal seed layer 122.

Figure 4:
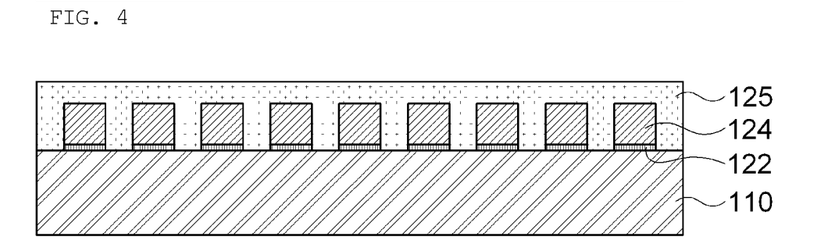

Referring to FIGS. 2 and 4, a lower polymer insulating layer 125 covering the lower pattern 124 may be formed (S114). The forming of the lower polymer insulating layer 125 may be performed by preparing a polymer material containing the polymer ions and then applying the polymer material on the substrate 110. Therefore, a circuit layer configured of the lower pattern 124 and the lower polymer insulating layer 125 covering the lower pattern 124 may be formed on the substrate 110.

Figure 5:
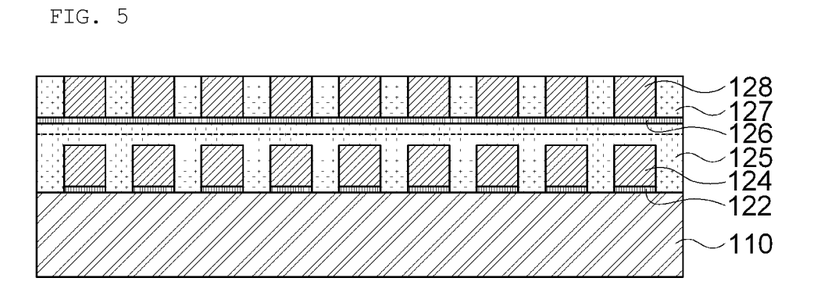

Referring to FIGS. 2 and 5, the upper pattern 128 may be formed on the lower polymer insulating layer 125 (S115). The forming of the upper pattern 128 may include forming a metal seed layer 126 on the lower insulating layer 125, forming a resist pattern 127 on the metal seed layer 126 and performing a plating process in which the resist pattern 127 is used as a plating preventing film. When the plating process is completed, the resist pattern 127 and the metal seed layer 126 may be sequentially removed.

Figure 6:
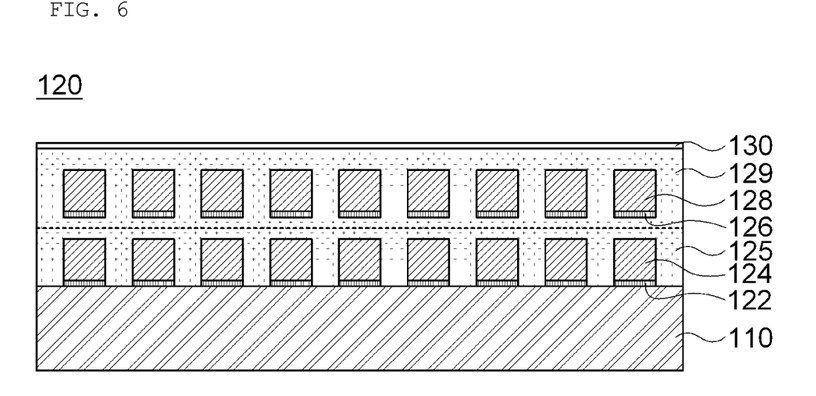

Referring to FIGS. 2 and 6, an upper polymer insulating layer 129 covering the upper pattern 128 may be formed (S116). The forming of the upper polymer insulating layer 129 may be largely similar to the process of forming the lower polymer insulating layer 125 described above. For example, the forming of the upper polymer insulating layer 129 may include applying the polymer for forming the lower polymer insulating layer 125 described above on the lower polymer insulating layer 125. Therefore, one polymer insulating layer configured of the upper and lower polymer insulating layers 125 and 129 made of the same polymer material may be formed on the substrate 110.

The adhesive layer 130 may be formed on the upper polymer insulating layer 129 (S117). The forming of the adhesive layer 130 may be performed by preparing a polymer material containing the electrolyte elements and applying the polymer material on the upper polymer insulating layer 129. The electrolyte elements may be at least one of sodium element (Na), potassium element (K), calcium element (Ca), magnesium element (Mg), and other various elements.

Through the processes as described above, one unit circuit structure 120 may be manufactured. The process of manufacturing the unit circuit structure as described above is repeatedly performed, thereby making it possible to prepare a plurality of first and second unit structures 120a and 120b.

Figure 7:
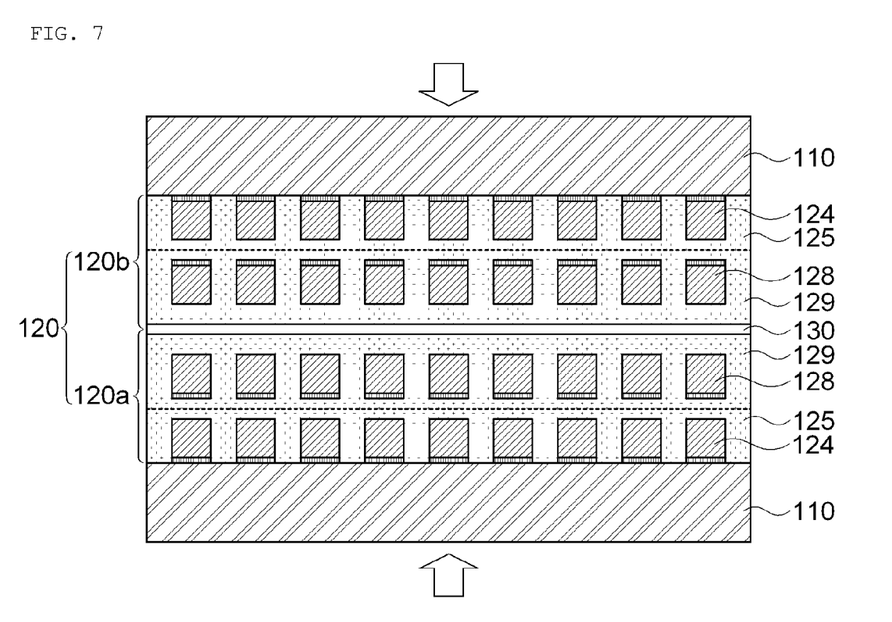

Referring to FIGS. 2 and 7, the unit circuit structures 120 may be laminated, having the adhesive layer 130 interposed therebetween (S120). For example, in the laminating of the unit circuit structure 120, the first and second unit structures 120a and 120b are aligned so that the adhesive layers 130 of the prepared first and second unit structures 120a and 120b face each other and the first and second unit structures 120a and 120b may be closely adhered. Therefore, a laminate in which the first and second unit structures 120a and 120b having the adhesive layer 130 interposed therebetween is laminated may be manufactured.

Figure 8:
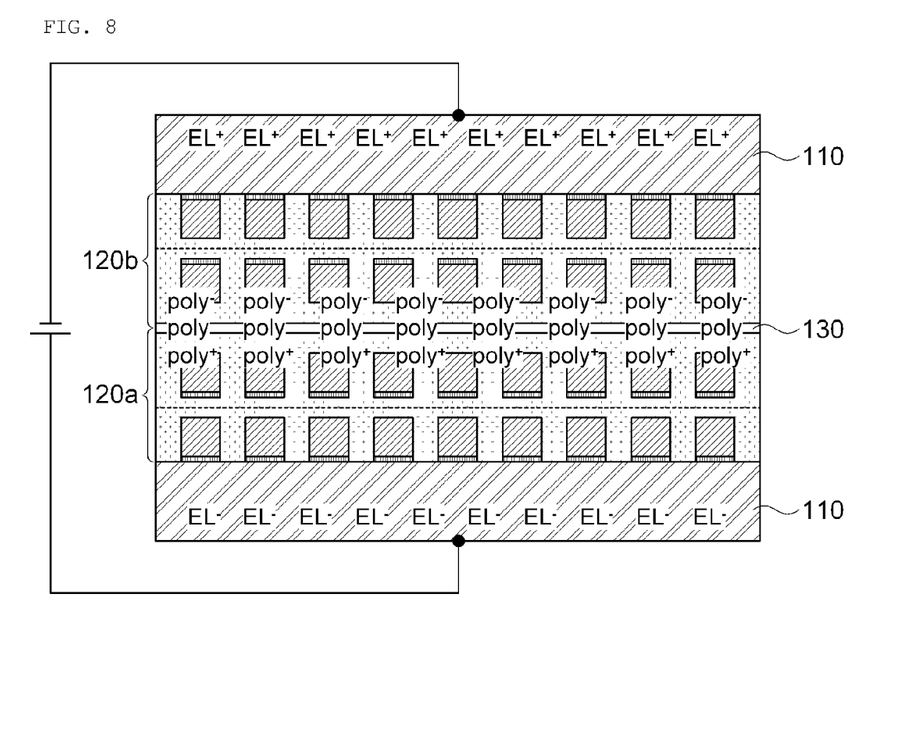

Referring to FIGS. 2 and 8, the unit circuit structures 120 may be adhered (S130). For example, voltage may be applied to the laminate formed of the first and second unit structures 120a and 120b. Therefore, an electric field is applied to the laminate, such that an electrolyte element ($EL^+$) having a positive charge among the electrolyte elements in the adhesive layer 130 may move to minus voltage and an electrolyte element ($EL^-$) having a negative charge may move to plus voltage. In addition, the polymer ions in the polymer insulating layer having relatively very low mobility may generally remain in the adhesive layer 130. In this case, a polymer ion (Poly+) having the positive charge and a polymer ion (Poly−) having the negative charge among the polymer ions are electrically or chemically coupled to each other, such that the first and second unit structures 120a and 120b may be adhered by the adhesive layer 130. By electrically coupling the polymer ion (Poly+) having the positive charge and the polymer ion (Poly−) having the negative charge as described above, the adhesive layer 130 may be lastly implemented as a polymer layer having electroneutrality.

Figure 9:
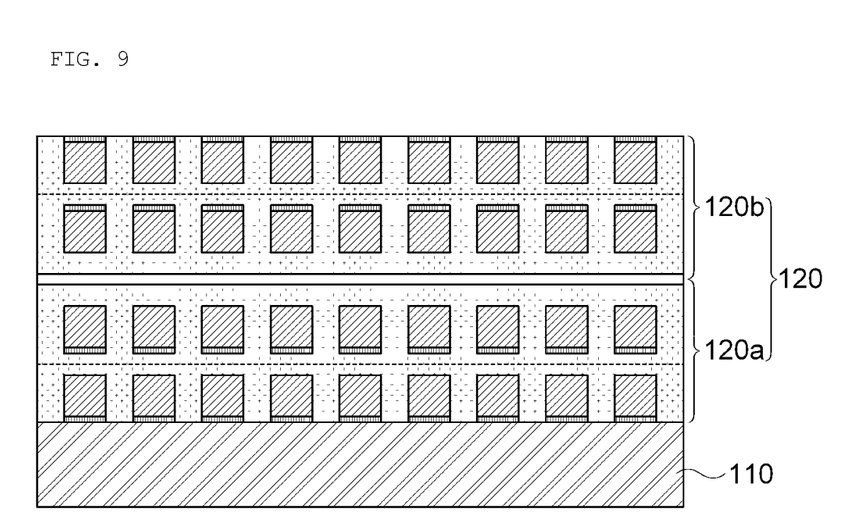

Referring to FIGS. 2 and 9, the substrate 110 may be removed from any one of the unit circuit structures 120 (S140). The removing of the substrate 110 may be performed by selectively removing the substrate 110 included in any one of the first and second unit structures 120a and 120b. In the present embodiment, although FIG. 9 shows the case in which the substrate 110 included in the second circuit structure 120b is removed, the substrate 110 included in the first circuit structure 120a may be removed. Therefore, any one of the substrates 110 included in the first and second unit structures 120a and 120b may be selectively removed, such that the thin film type chip device 100 in which another substrate 110 is used as the ferrite magnetic substrate may be manufactured.

As described above, the method for manufacturing the thin film type chip device according to the exemplary embodiment of the present invention may manufacture the thin film type chip device in the scheme in which the unit circuit structures 120 having the circuit patterns of the multi-layer structure are each manufactured and then laminated. In this case, it is possible to prevent the phenomenon in which the efficiency of the manufacturing process of the circuit pattern is decreased due to the bumpy surface phenomenon in which the surface of the photo-resist pattern has the convex shape, as compared to the method repeatedly laminating and forming the circuit layer formed of the circuit pattern and the polymer insulating layer covering the circuit pattern on the substrate.

The thin film type chip device according to the exemplary embodiment of the present invention includes the fine pitch and the coil patterns of the multi-layer structure having the high occupying area per unit area, thereby making it possible to have high impedance characteristics.

Since the thin film type chip device according to the exemplary embodiment of the present invention has the structure in which the circuit layers having the circuit patterns of the multi-layer structure are adhered to each other with the electrochemical coupling force by the adhesive layer and are laminated, it has the circuit structure having the circuit patterns of the multi-layer structure having the fine circuit pattern as compared to the structure in which the circuit layers are laminated using the photo-resist pattern without using the adhesive layer, thereby making it possible to greatly improve impedance characteristics.

Since the method for manufacturing the thin film type chip device according to the exemplary embodiment of the present invention manufactures the chip device having the multi-layer circuit pattern using the scheme in which the unit circuit structures having the circuit patterns of the multi-layer structure are prepared and then laminated, it prevents a phenomenon that non-uniform circuit patterns are manufactured on each layer as compared to a method repeatedly forming the circuit layer having single layer circuit pattern on the substrate, thereby making it possible to have the multi-layer circuit pattern of the fine pitch to manufacture the thin film type chip device having high impedance characteristics.

In addition, the method for manufacturing the thin film type chip device according to the exemplary embodiment of the present invention laminates unit circuit structures having the adhesive layer interposed therebetween and the adhesive layer adheres the unit circuit structures to each other with the electrochemical coupling force, thereby making it possible to improve efficiency of a manufacturing process, as compared to a method for sequentially forming the circuit layers on the substrate without using the adhesive layer.

The above detailed description has illustrated the present invention. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A thin film type chip device, comprising:
   a substrate;
   a plurality of unit circuit structures laminated on the substrate; and
   an adhesive layer adhering the unit circuit structures to each other,
   wherein the adhesive layer is an electrolyte polymer layer containing electrolyte elements.

2. The thin film type chip device according to claim 1, wherein each of the unit circuit structures includes:
   a lower pattern;
   a lower polymer insulating layer covering the lower pattern;
   an upper pattern disposed over the lower pattern; and
   an upper polymer insulating layer having the same material as the lower polymer insulating layer and covering the upper pattern and the lower polymer insulating layer.

3. The thin film type chip device according to claim 1, wherein each of the unit circuit structures includes:
   a metal coil pattern of a multi-layer structure; and
   a polymer insulating layer covering the metal coil pattern.

4. The thin film type chip device according to claim 1, wherein the substrate is a ferrite magnetic substrate.

5. The thin film type chip device according to claim 1, wherein the adhesive layer includes at least one of sodium element (Na), potassium element (K), calcium element (Ca), and magnesium element (Mg).

6. The thin film type chip device according to claim 1, wherein the adhesive layer has electroneutrality by electrically coupling a polymer ion having a positive charge and a polymer ion having a negative charge to each other.

7. A method for manufacturing a thin film type chip device, the method comprising:
   preparing a plurality of unit circuit structures;
   manufacturing a laminate by laminating the unit circuit structures; and
   adhering the unit circuit structures to each other,
   wherein the preparing of the unit circuit structures includes:
      forming a circuit layer having a metal coil of a multi-layer structure and a polymer insulating layer covering the metal coil; and forming an adhesive layer having electrolyte elements on the circuit layer, and wherein the adhering of the unit circuit structures includes applying voltage to the laminate.

8. The method according to claim 7, wherein the preparing of the unit circuit structures includes:
preparing a substrate;
forming a lower pattern on the substrate;
forming a lower polymer insulating layer covering the lower pattern;
forming an upper pattern on the lower polymer insulating layer; and
forming an upper polymer insulating layer having the same material as the lower polymer insulating layer on the upper pattern.

9. The method according to claim 7, wherein the preparing of the unit circuit structures includes:
forming a circuit layer having a metal coil of a multi-layer structure; and
forming an adhesive layer on the circuit layer,
wherein the laminating of the unit circuit structures includes aligning the unit circuit structures so that the adhesive layers of the unit circuit structures face each other.

10. The method according to claim 7, wherein the preparing of the unit circuit structures includes:
preparing a ferrite magnetic substrate; and
forming a circuit layer having a metal coil of a multi-layer structure on the ferrite magnetic substrate.

11. The method according to claim 7, wherein the preparing of the unit circuit structures includes:
preparing a substrate; and
forming a circuit layer having a metal coil of a multi-layer structure on the substrate,
the method further comprising, after the adhering of the unit circuit structures, removing the substrate from any one of the unit circuit structures.

* * * * *